United States Patent [19]

Bauer et al.

[11] 4,368,441

[45] Jan. 11, 1983

[54] KEY ASSEMBLY

[75] Inventors: Karl-Heinz Bauer, Bad Neustadt/Saale; Gerold Eckert, Brendlorenzen; Reinhold Wolf, Bad Naustadt/Saale, all of Fed. Rep. of Germany

[73] Assignee: Pren Elektrofeinmecahnische Wereke Jakob Preh Nachf. GmbH & Co., Neustadt, Fed. Rep. of Germany

[21] Appl. No.: 254,635

[22] Filed: Apr. 16, 1981

[30] Foreign Application Priority Data

Apr. 21, 1980 [DE] Fed. Rep. of Germany ....... 3015292

[51] Int. Cl.³ ................................................ H03J 1/02

[52] U.S. Cl. ......................................... 334/15; 334/7; 334/87

[58] Field of Search ..................... 74/10.33; 334/7, 15, 334/87; 455/180, 185–188, 195, 199; 116/336

[56] References Cited

U.S. PATENT DOCUMENTS 3,508,176 4/1970 Labude et al. .................... 334/15 X 3,743,976 7/1973 Meyer et al. ..................... 334/15 X 4,097,828 6/1978 Hinderlmayr et al. ................. 334/7

FOREIGN PATENT DOCUMENTS 1950036 1/1977 Fed. Rep. of Germany .

*Primary Examiner*—Paul L. Gensler

*Attorney, Agent, or Firm*—Woodcock, Washburn, Kurtz, Mackiewicz & Norris

[57] ABSTRACT

A key assembly for receivers for communication systems, especially radio and television receivers, comprises a casing, keys adapted for mutual release by means of a spring-loaded locking plate for switching in storable, selectively adjustable electrical values of channel memories consisting of a plurality of voltage dividers for variable capacitance diode tuning, rotary and slidable press buttons associated with the respective keys for channel tuning and optionally for selecting a frequency range, which is adjustable in a preferably pressed position of the rotary press button being different from the tuning position by turning into various locking angular positions, as well as a channel and frequency range indicator scale. According to the invention said indicator scale simultaneously is the locking plate for the keys.

8 Claims, 2 Drawing Figures

KEY ASSEMBLY

BACKGROUND OF THE INVENTION

1. Field of the Invention

The invention relates to a key assembly for receivers of communication systems, especially radio and television receivers, comprising a casing, keys adapted for mutual release by means of a spring-loaded locking plate for switching in storable, selectively adjustable electrical values of channel memories consisting of a plurality of voltage dividers for variable capacitance diode tuning, rotary and slidable press buttons associated with the respective keys for channel tuning and optionally for selecting a frequency range, which is adjustable in a preferably pressed position of the rotary press button being different from the tuning position by turning into various locking angular positions, as well as a channel and frequency range indicator scale.

2. Brief Description of the Prior Art

Various embodiments of such key assemblies are being used preferably in tuning and switching on high frequency receivers such as radio or television receivers, for example. By means of a single key pressing operation the preset tuning voltage and thus the associated station or channel, respectively, can be switched in. Storage of the set tuning voltage takes place in channel memories in the form of spindle-type resistors or variable resistors connected as voltage dividers.

It has already been known to use a key switch set for actuating slide switches (German Patent Application No. 1,950,036 published for opposition) which are mutually releasable by means of a locking plate. Within a metal channel having a U-shaped cross-section the key rods of the slide switches are slidably mounted in the upright channel walls. The channel comprises a metallic locking plate parallel to the bottom, which is provided with profiled openings which are engaged by extensions provided on the key rods. The cross-sectional configuration of the extensions is such that on sliding the key rods a force is exerted on the locking plate in the longitudinal direction of the channel. The locking plate itself is biased by a hairpin-type return spring. One leg of the return spring is received in recesses in the channel walls, whereas the other leg engages an opening in the locking plate.

U.S. Pat. No. 3,508,176 discloses a key assembly for television receivers, wherein the keys are mutually releasable by a spring-loaded locking plate. This locking plate is mounted in a U-shaped metal channel on one of the channel walls for sliding perpendicularly to the sliding direction of the keys. The keys serve to switch in the preset tuning voltage for variable capacitance diodes. Storage of the tuning voltage is effected through voltage dividers in the form of spindle-type resistors. When used in a television receiver, it is also possible to select the frequency ranges by means of the keys. To this end the key in its pulled position can be moved into various locking angular positions by turning. At the same time an adjusting element is rotated thereby which is connected to a sliding matrix. As channel and frequency range indicator this matrix carries a plurality of channel scales associated with the respective frequency ranges and being visible in a window provided in the casing. Each key has its own matrix associated therewith, the matrices being arranged parallel to one another and guided in the casing such as to provide for possible mutual overlap. In this embodiment the arrangement is similar to that of roofing tiles, i.e. provides for a small inclination toward the plane of the central axes of the matrices. On account of the fact that each key has a matrix of its own, the construction of the key assembly is very expensive.

SUMMARY OF THE INVENTION

It is an object of the present invention to provide a key assembly of the type described initially which comprises fewer component parts and can thus be manufactured at lower cost without any necessity of dispensing with ease of control.

This problem is solved in accordance with the invention in that the indicator scale simultaneously is the locking plate for the keys.

Further advantageous embodiments of the invention can be seen from the sub-claims.

BRIEF DESCRIPTION OF THE DRAWINGS

The invention and further particulars will be described more specifically hereinafter with reference to two preferred embodiments shown in the drawings.

DETAILED DESCRIPTION OF THE PREFERRED EMBODIMENTS OF THE INVENTION

Figure 1:
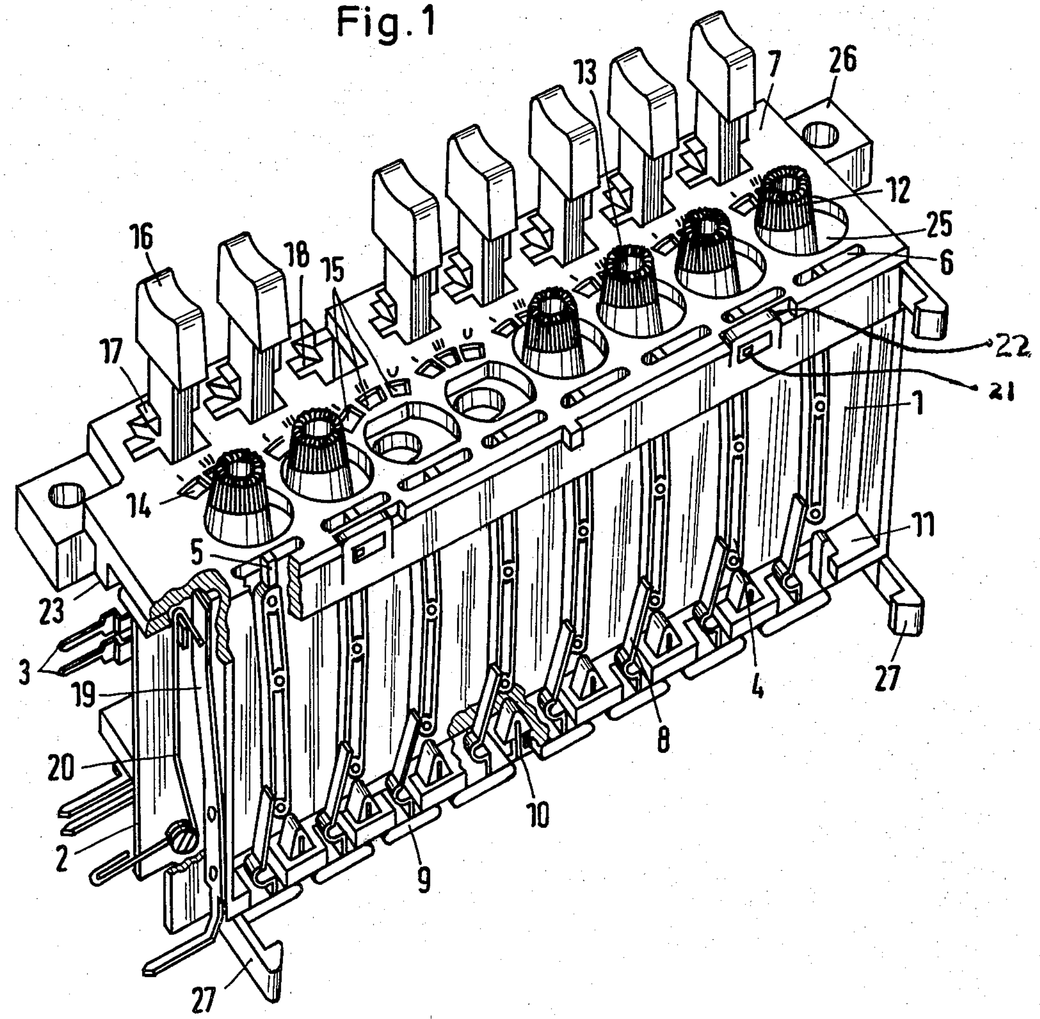
FIG. 1 is a perspective, partially sectional view of a key assembly.

The key assembly shown in FIG. 1 has eight keys, e.g., for switching in the tuning voltages having been preset in the individual channel memories. The channel memories consist of spindle-type resistors not shown in the drawings, wherein a spring support is guided along a spindle in sliding contact therewith by turning a rotary press button. The sliding contact establishes an electrical connection between a collector path or the spindle and the resistor element, which is mounted in a multiple unit array on an insulating plate of hard paper or plastic in a manner known per se. This insulating plate denoted by reference numeral 2 in FIG. 1 forms the closure of a casing 1 having one open end. For reasons of stability and consequently accuracy of recurrence or repeatability the casing is made of glass fiber-reinforced plastic material. As can be seen from FIG. 1, the soldering lugs 3 of the resistor elements project laterally from the casing.

Each spring support has an extension extending therefrom through an elongated hole in the casing and engaging a groove of a spring tongue 4. This spring tongue serves as indicator member for the set tuning voltage or for the set channel, respectively. When the spindle is rotated, the extension of the spring support slides along the groove. On account of the fact that the spring tongue has a slight curvature or bent configuration the spring tongue performs a minor swinging movement as the spindle is rotated.

During this movement the free end 5 of the spring tongue 4 projects into an elongate window 6 cut out in a locking plate 7. The length of the window corresponds approximately to the swinging movement. The motion of the protruding end 5 with respect to indicia (not shown) on the plate 7 provides an indication of the tuning and channel selected. Each of the spring tongues 4 is connected to a base 9 through a hinge 8. This base 9 is held in locking engagement with one of the longitudinal walls 11 of the casing by a plurality of elastic spreaders 10. The base, the hinge, the spring tongues and the spreaders are integrally formed from plastic.

On one of its ends the spindle not shown in the drawings is provided with a rotary press button having a grooved edge or an edge portion to which the gripping capacity has been imparted otherwise. Thereby the rotary press button can be turned directly. However, the rotary press button 12 may additionally be provided also with a cavity 13 having a specific inner contour. For tuning, a socket key not shown in the drawings is inserted into this cavity, said socket key having an outer contour and engaging the inner contour.

Between the rotary press button and the casing a snap-engaged coupling element made of plastic is provided, which is not shown in the drawings. This coupling element has spring tongues in circular array on its circumference which interact with a chamfer on the outer face of the rotary press button. Furthermore the rotary press button has an axially parallel toothing, the teeth of which in their pressed condition project into a cross-shaped profile of the coupling element. Thereby the coupling element is positively engaged and a frequency range selection can be made. The coupling element furthermore comprises a pointer 14 formed integrally therewith, which is visible in one of the three segmentally arranged frequency range selection display windows 15 of the locking plate 7, depending on the respective locking position.

A number of keys 16 corresponding to the number of rotary press buttons are slidingly mounted in the casing 1. With the aid of these keys the preset channel can be switched in. All keys are mutually releasable by a locking plate 7. Owing to the fact that the locking plate 7 simultaneously forms the indicator scale the key assembly can be built of few component parts and can thus be manufactured at lower cost. Since the key assembly is produced in large quantities, this economization makes itself felt considerably. In case that inadvertently all keys together should have been pressed, release can be obtained by lateral displacement of the locking plate which is easily accessible from the outside.

Each key 16 has a lateral extension 17 formed integrally therewith and being provided with a chamfer. This extension 17 interacts with a sawtooth projection 18 of the locking plate 7 as mutual release mechanism. Thus, when any one of the keys 16 is depressed to select a channel, it is held down by the extension 17 being disposed underneath projection 18. Depressing any key 16 displaces the locking plate 7, releasing any previously selected key 16.

As can be seen from FIG. 1, the locking plate 7 is urged into a rest position by a return spring 19. However, this return spring simultaneously is the contact spring for a so-called quiet switch contact. When a key is pressed and thereby the locking plate is displaced laterally, the return spring contacts a second contact spring 20 during the switching operation. Thereby disturbing switching clicks are to be suppressed during channel switch-over.

Guidance of the locking plate 7 on the front surface of the casing is effected in that the locking plate has detents 21 formed integrally with its longitudinal edges, which interact with receiving elements 22 of the casing. Furthermore the locking plate is provided on its underside with an integrally formed ridge 23 extending from the small side in the sliding direction. This ridge is guided in a groove 24 (shown in FIG. 2) of the casing. Since the detents project into the receiving elements and the locking plate has to perform a sliding stroke, the receiving elements 22 have the form of slots extending in the sliding direction, the length of which has to correspond at least to the length of the sliding stroke. The openings 25 in the locking plate, through which the rotary press buttons 12 and the keys 16 extend, likewise have been increased by at least the length of the sliding stroke.

The casing comprises lateral attachment members 26 formed integrally with each of its small faces, with the aid of which the key assembly can be attached to the chassis of a television receiver, for example.

Figure 2:
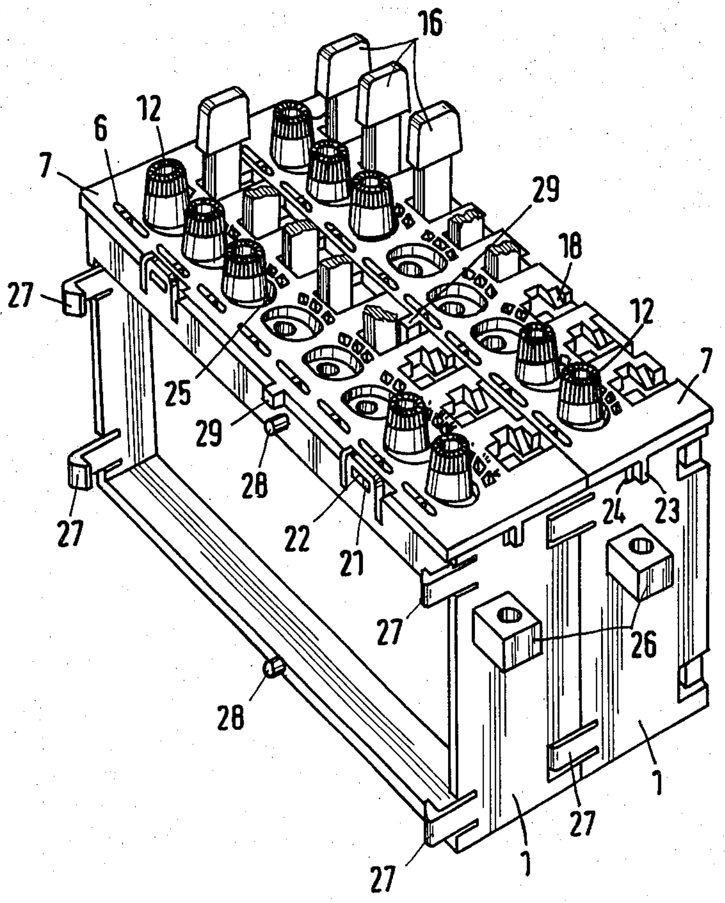
FIG. 2 is a perspective view of a multiple unit key assembly system.

As modular unit the embodiment shown in FIG. 1 is adapted to store up to eight channels. If even more channels are desired, a plurality of key assemblies can be combined to a modular system as shown in FIG. 2. To this end each modular unit is provided with snap hooks 27 on one side of the casing, which engage openings of the adjacent modular unit. Furthermore, locking pins 28 are provided for accurate positioning of the modular units with respect to one another. When several key assemblies have been combined, all keys are to be mutually releasable in this system as well. To this end each locking plate has a lateral carrier arm 29 on one of its longitudinal sides, which engages a profiled recess of the following locking plate and guarantees operative engagement free from play or lost motion.

What is claimed:

1. A key assembly for receivers of communication systems, especially radio and television receivers, comprising a casing, keys adapted for mutual release by means of a sliding, spring-loaded locking plate for switching in storable, selectively adjustable electrical values of channel memories consisting of a plurality of voltage dividers for variable capacitance diode tuning, rotary and slidable press buttons associated with the respective keys for channel tuning and optionally for selecting a frequency range, which is adjustable in a preferably pressed position of the rotary press button being different from the tuning position by turning into various locking angular positions, as well as a unitary channel and frequency range indicator scale, characterized in that said indicator scale and the locking plate (7) for the keys (16) are one and the same.

2. The key assembly as claimed in claim 1, characterized in that the unitary indicator scale and locking plate (7) are mounted on the front surface of the casing (1).

3. The key assembly as claimed in claim 1, characterized in that the unitary indicator scale and locking plate (7) in its sliding direction has detents (21) formed integrally with the plate edge on both sides, which detents interact with receiving elements (22) formed in the casing.

4. The key assembly as claimed in claim 3, characterized in that the receiving elements are elongated slots (22) extending in the sliding direction and having a length increased by at least the length of the sliding stroke of the unitary indicator scale and locking plate (7).

5. The key assembly as claimed in claim 1, characterized in that the casing (1) has grooves in the front surface extending in the sliding direction of the unitary indicator scale and locking plate (7), into which protruding ridges (23) of the indicator scale or locking plate (7) project.

6. The key assembly as claimed in claim 1, characterized in that the unitary indicator scale and locking plate (7) is spring-loaded by a return spring (19) simultaneously being the contact spring for a quiet switch contact (19, 20).

7. The key assembly as claimed in any of claims 1 to 6, characterized in that the unitary scale and locking plate (7) is provided with openings (25) for the keys (16) and the rotary press buttons (12) extending therethrough, the extension of said openings being increased in the sliding direction by at least the length of the sliding stroke.

8. The key assembly as claimed in claim 1, characterized in that a plurality of said key assemblies may be combined in a modular system by means of retaining studs (28) and snap means (27) formed on each casing, and each unitary indicator scale or locking plate (7) has a carrier arm (29) on one of its longitudinal sides, for engagement with a suitably shaped recess of the adjacent unitary indicator scale and locking plate (7), whereby all of said unitary indicator scales and locking plates move as one.

* * * * *